United States Patent [19]

Campisano et al.

[11] Patent Number: 5,723,372
[45] Date of Patent: Mar. 3, 1998

[54] METHOD AND APPARATUS FOR FORMING BURIED OXIDE LAYERS WITHIN SILICON WAFERS

[75] Inventors: Salvatore Ugo Campisano, Catania; Vito Raineri, Mascalucia, both of Italy

[73] Assignee: Consorzio per la Ricerca sulla Microelettronica nel Mezzogiorno, Catania, Italy

[21] Appl. No.: 527,850

[22] Filed: Sep. 14, 1995

[30] Foreign Application Priority Data

Sep. 23, 1994 [EP] European Pat. Off. ............. 94830452

[51] Int. Cl.$^6$ .................................................. H01L 21/762
[52] U.S. Cl. .................. 438/164; 438/438; 438/407; 438/766
[58] Field of Search .................. 432/24, 26, 62, 432/940; 438/162, 164, 405, 407, 412, 526, 528, 766

[56] References Cited

U.S. PATENT DOCUMENTS

| 4,704,302 | 11/1987 | Bruel et al. | 427/38 |
| 5,372,952 | 12/1994 | Aronowitz | 437/24 |
| 5,374,564 | 12/1994 | Bruel | 437/26 |

FOREIGN PATENT DOCUMENTS 2 211 991  7/1989  United Kingdom .

OTHER PUBLICATIONS

European Search Report from European Patent Application Serial Number 94830452.2, filed Sep. 23, 1994.
International Electron Devices Meeting 1986, Dec. 7–10, 1986, New York pp. 431–434, E.J. Zorinsky et al. "The Islands Method—A Manufacturable Porous Silicon Soi Technology".

Primary Examiner—Chandra Chaudhari
Attorney, Agent, or Firm—Wolf, Greenfield & Sacks, P.C.; James H. Morris

[57] ABSTRACT

A method and apparatus for forming buried oxide layers within silicon wafers comprising several steps. Recesses are formed in a silicon wafer. Light ions are implanted in the silicon wafer at a depth that is smaller than the depth of the recesses to form bubbles of the light ions in the silicon wafer. The light ions are evaporated from the silicon wafer to leave cavities in the place of the bubbles. The cavities are oxidized through the recesses to form a buried layer of silicon oxide.

35 Claims, 2 Drawing Sheets

METHOD AND APPARATUS FOR FORMING BURIED OXIDE LAYERS WITHIN SILICON WAFERS

BACKGROUND OF THE INVENTION

1. Field of the Invention

The present invention relates to a method and apparatus for forming buried oxide layers within silicon wafers.

2. Discussion of the Related Art

It is known that the availability of thin layers of high-quality single-crystal silicon on insulating material (SOI, Silicon on Insulator) is a fundamental prerequisite for manufacturing various devices, including CMOS, MOSFET, three-dimensional ICs and, more generally, radiation resistant devices to be used in space or in hostile environments.

There are various established methods for producing SOI materials. Among them, the methods that are significant for the production of semiconductor devices are known as "Silicon on Sapphire" (SOS) and "Separation by Implanted Oxide" (SIMOX).

The SOS method consists in depositing (generally by Chemical Vapor Deposition (CVD)) epitaxial silicon on single-crystal substrates of aluminum oxide, $Al_2O_3$. The quality of grown silicon is acceptable, although mainly geminate defects occur at the silicon-crystal interface. A limit to the spread of this technology is the high cost of substrates of single-crystal aluminum oxide with a diameter that is compatible with current values of single-crystal silicon wafers (5 or 6 inches).

The SIMOX method instead consists of implanting oxygen ions in high doses within single-crystal silicon substrates. Ion implanting must be performed at high temperature to prevent the surface layers from becoming amorphous, and must be followed by a process at very high temperature to remove the residual damage and to form a compact oxide layer. The high dose of oxygen ions to be implanted and the high temperatures required to eliminate the defects lead to high costs and barely acceptable qualities due to the defects that are present in the silicon layer and to the deformations applied to the entire wafer.

Alternate methods are based on growing epitaxial silicon on windows opened in a layer of thermal oxide grown on silicon substrates. Silicon regrowth proceeds first vertically, up to the level of the grown oxide layer, and then both vertically and horizontally. However, the growth rates are slow and/or produce poor-quality material.

One aim of the present invention is therefore to provide a method for forming buried oxide layers within silicon wafers that is simpler than known methods.

Within the scope of this aim, an object of the present invention is to provide a method for forming buried oxide layers within silicon wafers that is capable of producing high-quality material.

Another object of the present invention is to provide a method for forming buried oxide layers within silicon wafers that has low costs with respect to known methods.

SUMMARY OF THE INVENTION

The foregoing objects and others, which will become apparent hereinafter, are achieved by a method for forming buried oxide layers within silicon wafers including several steps. In one embodiment of the invention, recesses are formed in a silicon wafer and light ions are implanted in the silicon wafer at a depth that is smaller than the depth of the recesses to form bubbles of the light ions in the silicon wafer. The light ions are evaporated from the silicon wafer to leave cavities in the silicon wafer. The cavities are oxidized through the recesses to form a buried layer of silicon oxide.

One aspect of the present invention is that the above mentioned method can also be performed in a plurality of sequences.

The features and advantages of the present invention will become apparent from the following detailed description when taken in connection with the following drawings. It is to be understood that the drawings are for the purpose of illustration and are not intended as a definition of the limits of the invention.

DETAILED DESCRIPTION

Figure 1:
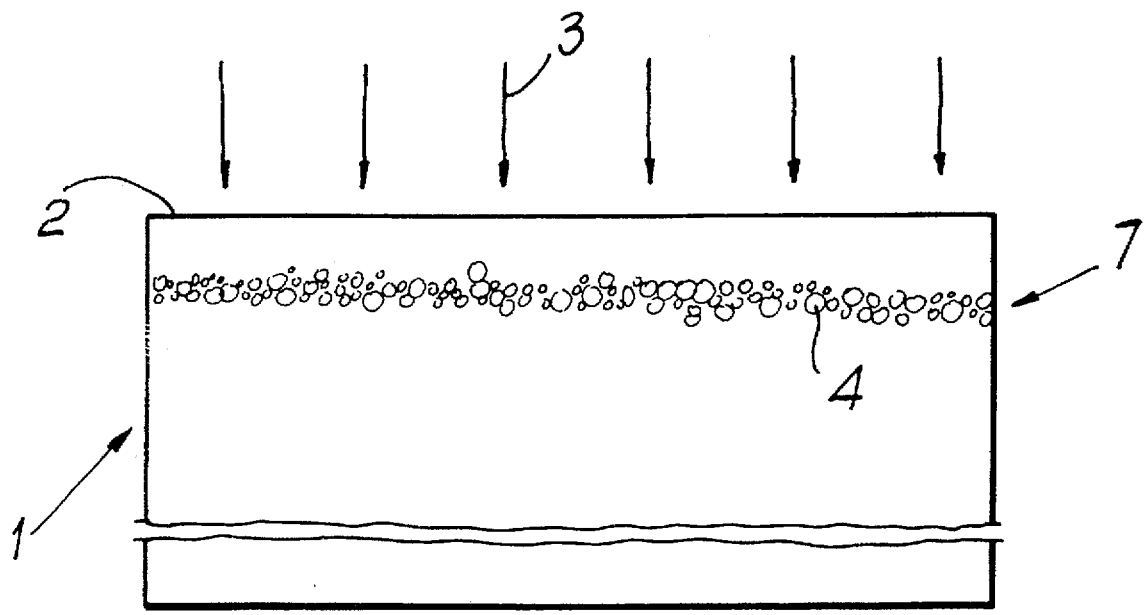
FIG. 1 is a cross-sectional view of a silicon wafer containing gas bubbles.

With reference to FIG. 1, a silicon wafer 1 is subjected to ion implanting on its entire surface 2 with low-mass inert ions 3, preferably helium. Implanting occurs with relatively high helium doses which vary according to the implanting energy. For example, for an implanting energy of 20 KeV the dose is on the order of approximately $5 \times 10^{16}$ atoms/sq cm, whereas for an energy of 300 KeV the dose is equal to approximately $1 \times 10^{16}$ atoms/sq cm.

A high density of small helium bubbles 4 forms at the average penetration depth of the ions 3. Penetration depth varies according to the implanting energy. For a value of 20 KeV of the implanting energy, penetration depth is equal to 0.3 micrometers, whereas for an energy of 300 KeV penetration depth is equal to 1 micrometer.

The silicon wafer 1 is then subjected to heat treatments at temperatures above 700° C. These heat treatments are capable of diffusing the helium present in the bubbles 4 up to the surface 2 of the silicon wafer 1, leaving a buried layer 7 of empty cavities in the place of the bubbles 4.

Figure 2:
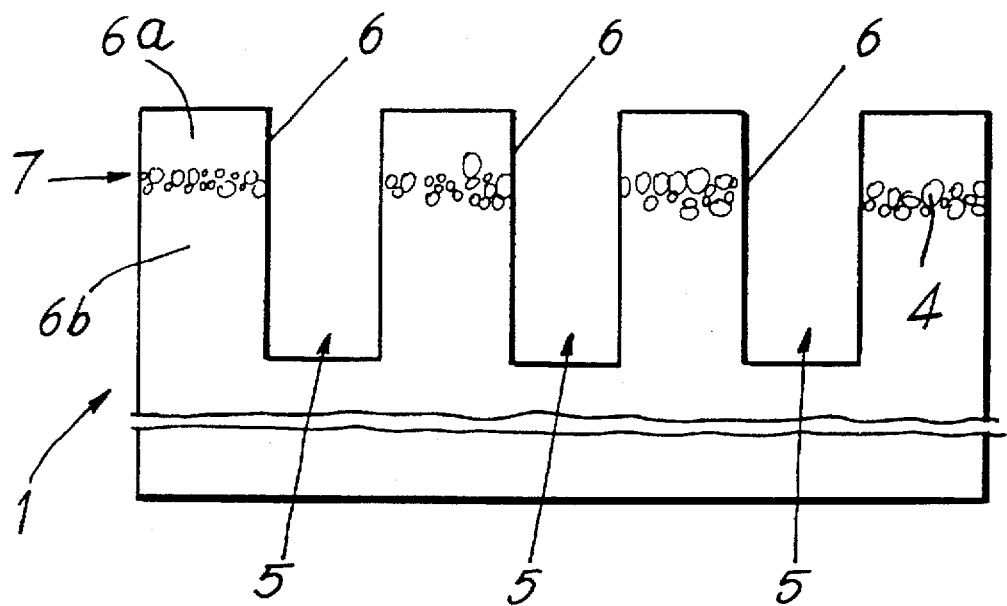
FIG. 2 is a view of the silicon wafer, which comprises trenches for the passage of oxygen.

Then, with reference to FIG. 2, recesses or trenches 5 are formed in the silicon wafer so that they are deeper than the depth at which the cavities 4 are located.

This leaves protruding portions 6 which are divided by the cavities 4 into an upper section 6a and a lower section 6b.

After forming the trenches 5, the silicon wafer 1 is placed in an oxidation furnace (not shown). A fast thermal oxidation system has been chosen in the present embodiment of the present invention, but the oxidation system can be different.

With this oxidation system the silicon wafer 1 was subjected to the flux in an oxygen-rich environment and the temperature was raised to 1000° C. for 30 minutes.

Figure 3:
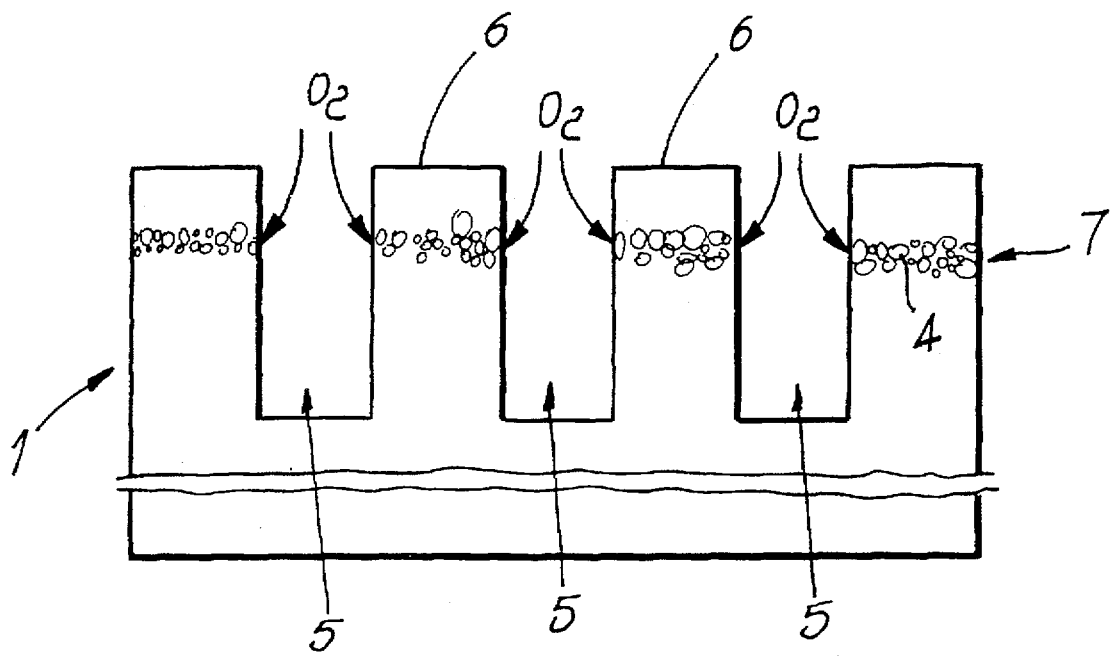
FIG. 3 is a view of the silicon wafer during the oxidation step.

The buried layer, which contains a high density of cavities 4, is uniformly oxidized through an oxide thickness that depends on the oxidation time and temperature, as shown in FIG. 3.

Oxidation of the buried silicon layer 7 is allowed by the transport of oxygen through the trenches 5 and in the porous structure of the cavity 4 formed by ion implanting.

Figure 4:
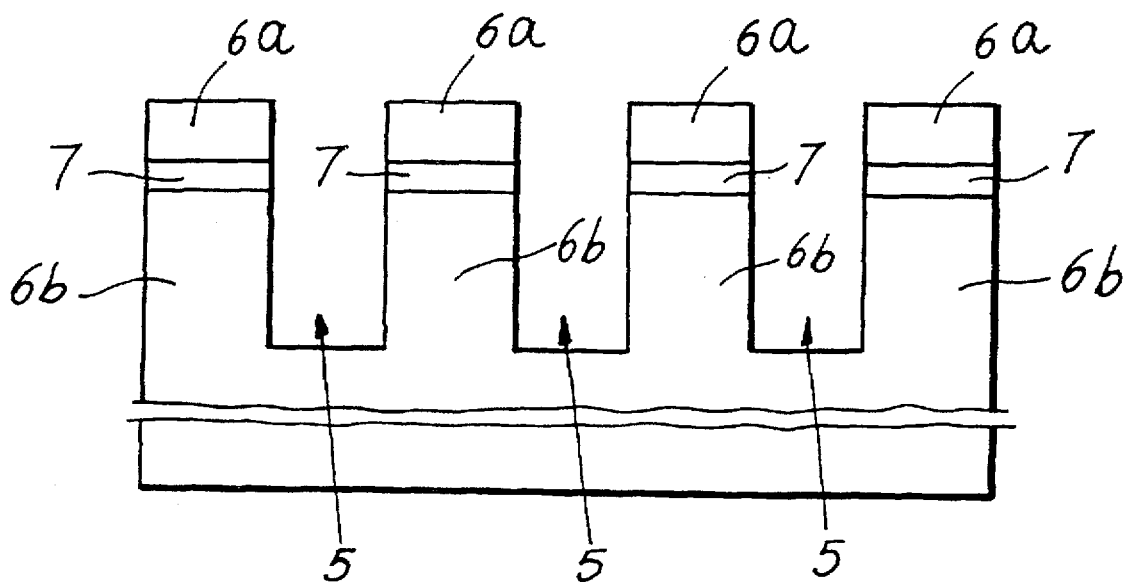
FIG. 4 is a view of the silicon wafer, which comprises the insulating layer.

This forms a uniform buried layer 8 that divides the protruding portions 6 into an upper silicon layer 6a and into a lower layer 6b, as shown in FIG. 4. The upper layer 6a, insulated by the buried oxide layer 8, is of high quality, since the slight damage thereof produced by the helium ion implanting is removed during the thermal process that produces oxidation. In particular, the damage occurs in the form of point-like defects which are eliminated by the thermal treatment.

Further thermal processes after the oxidation process are possible and can be used to improve the quality of the silicon itself. The wafer 1 thus obtained can then be introduced in any production cycle for forming semiconductor devices.

The method according to the present invention fully achieves the intended aim and objects. The method according to the present invention is simple, inexpensive, and obtains high-quality material. The simplicity of the method arises from the fact that only a small number of steps are required: the formation of the trenches 5; the implanting of light ions 3 to form cavities 4; and oxidation. These steps can also be performed in a sequence other than the one described herein.

The lower cost arises from the fact that no specialized substrates need be used and that the above described steps are well-known and normally used in the production of semiconductor devices. Intense beams of helium and other light ions can be easily extracted from conventional ion implanting machines.

The high quality of the material obtained arises from the fact that the light ions produce defects that can be easily eliminated close to the surface of the wafer.

The invention thus conceived is susceptible to numerous modifications and variations, all of which are intended to be within the scope of the inventive concept.

Thus, for example, various light elements can be used instead of helium. The formation of bubbles by implanting hydrogen and noble gases, including even heavier ions (included in any case within the category of light atoms) such as neon, is known in the art.

It is furthermore possible to form the trench structure 5 first and then implant the ions.

The structure shown in FIG. 2 can furthermore be formed in different ways. For example, the silicon columns or protruding portions 6 can be grown on the surface of the wafer 1.

In this way the various production steps can be performed in different orders. The cavities 4 can also be formed during the oxidation process itself instead of as a separate step.

Having thus described at least one illustrative embodiment of the invention, various alterations, modifications, and improvements will readily occur to those skilled in the art. Such alterations, modifications and improvements are intended to be part of this disclosure, and are intended to be within the spirit and scope of the invention. For example, the materials employed, as well as their shapes and dimensions, may be modified according to the requirements of the device. Accordingly, the foregoing description is by way of example only and is not intended as limiting. The invention is limited only as defined in the following claims and the equivalents thereto.

What is claimed is:

1. A method for forming buried oxide layers within a silicon wafer, the method comprising the steps of:

forming recesses in said silicon wafer;

implanting light ions in said silicon wafer, at a depth that is less than a depth of said recesses, to form bubbles of said light ions in said silicon wafer; and evaporating said light ions through said silicon wafer to leave cavities where said bubbles had been; and oxidizing said cavities through said recesses to form a buried oxide layer of silicon oxide in said silicon wafer, wherein said recesses are formed before said light ions are implanted.

2. A method for forming buried oxide layers within a silicon wafer, the method comprising the steps of:

forming recesses in said silicon wafer;

implanting light ions in said silicon wafer, at a depth that is less than a depth of said recesses, to form bubbles of said light ions in said silicon wafer; and evaporating said light ions through said silicon wafer to leave cavities where said bubbles had been; and oxidizing said cavities through said recesses to form a buried oxide layer of silicon oxide in said silicon wafer, wherein said step of forming recesses includes growing protruding portions of silicon on said silicon wafer.

3. A method of forming at least one buried insulating layer within a semiconductor material, the method comprising the steps of:

(a) providing a layer of semiconductor material, said layer of semiconductor material having at least one protrusion of said semiconductor material formed on a surface of said semiconductor material;

(b) implanting ions of a gas within said at least one protrusion, said ions forming gaseous bubbles within said at least one protrusion;

(c) evaporating said gaseous bubbles from said at least one protrusion to form cavities in said at least one protrusion, where said gaseous bubbles had been; and (d) exposing said cavities to a reactive gas to form at least one buried insulating layer in said at least one protrusion, where said cavities had been.

4. The method according to claim 3, wherein step (a) includes depositing an amount of said semiconductor material on said surface of said layer of semiconductor material to form said at least one protrusion.

5. The method according to claim 3, wherein step (a) includes forming at least one recess in said layer of semiconductor material to form said at least one protrusion.

6. The method according to claim 3, wherein said layer of semiconductor material is silicon.

7. The method according to claim 3, wherein step (b) includes implanting ions of a noble gas.

8. The method according to claim 3, wherein step (b) includes implanting ions of a gas selected from a group consisting of helium, neon, hydrogen and mixtures thereof.

9. The method according to claim 3, wherein step (c) includes heating said layer of semiconductor material.

10. The method according to claim 9, wherein step (c) includes eliminating defects in said layer of semiconductor material produced by said implanting step.

11. The method according to claim 9, wherein step (c) includes heating said layer of semiconductor material to a temperature above 700° C.

12. The method according to claim 3, wherein step (d) includes exposing said cavities to a gas selected from the group consisting of oxygen, nitrogen, carbon and mixtures thereof.

13. The method according to claim 3, wherein step (d) includes exposing said cavities to oxygen.

14. The method according to claim 13, wherein step (d) includes using an oxidation furnace.

15. The method according to claim 13, wherein step (d) is performed at a temperature of about 1000° C. for about 30 minutes.

16. The method according to claim 3, further comprising a step of treating said layer of semiconductor material with at least one thermal process after step (d).

17. The method according to claim 3, wherein step (b) includes implanting helium ions within said at least one protrusion.

18. The method according to claim 1, wherein the light ions are noble gas ions.

19. The method according to claim 1, wherein the light ions are helium ions.

20. The method according to claim 1, wherein the light ions are neon ions.

21. The method according to claim 1, wherein the light ions are hydrogen ions.

22. The method according to claim 1, wherein the evaporating step includes eliminating defects in the silicon surface produced by the implanting step.

23. The method according to claim 1, wherein the evaporating step includes heating the silicon wafer to a temperature above 700° C.

24. The method according to claim 1, wherein the oxidizing step includes exposing said cavities to a gas selected from the group consisting of oxygen, nitrogen, carbon and mixtures thereof.

25. The method according to claim 1, wherein the oxidizing step is performed at a temperature of about 1000° C. for about 30 minutes.

26. The method according to claim 1, farther comprising, after the oxidizing step, a step of treating the silicon wafer with at least one thermal process.

27. The method according to claim 2, wherein the light ions are noble gas ions.

28. The method according to claim 2, wherein the light ions are helium ions.

29. The method according to claim 2, wherein the light ions are neon ions.

30. The method according to claim 2, wherein the light ions are hydrogen ions.

31. The method according to claim 2, wherein the evaporating step includes eliminating defects in the silicon surface produced by the implanting step.

32. The method according to claim 2, wherein the evaporating step includes heating the silicon wafer to a temperature above 700° C.

33. The method according to claim 2, wherein the oxidizing step includes exposing the cavities to a gas selected from the group consisting of oxygen, nitrogen, carbon and mixtures thereof.

34. The method according to claim 2, wherein the oxidizing step is performed at a temperature of about 1000° C for about 30 minutes.

35. The method according to claim 2, further comprising, after the oxidizing step, a step of treating said silicon wafer with at least one thermal process step after the oxidizing step.

* * * * *